(12) United States Patent
Mikami

(10) Patent No.: US 9,448,469 B2
(45) Date of Patent: Sep. 20, 2016

(54) REFLECTIVE MASK BLANK FOR EUV LITHOGRAPHY, OR REFLECTIVE LAYER-COATED SUBSTRATE FOR EUV LITHOGRAPHY, AND PROCESS FOR ITS PRODUCTION

(71) Applicant: Asahi Glass Company, Limited, Chiyoda-ku (JP)

(72) Inventor: Masaki Mikami, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 32 days.

(21) Appl. No.: 14/465,280

(22) Filed: Aug. 21, 2014

(65) Prior Publication Data
US 2015/0160548 A1    Jun. 11, 2015

(30) Foreign Application Priority Data

Dec. 5, 2013 (JP) ................................. 2013-251971

(51) Int. Cl.
*G03F 1/24* (2012.01)
(52) U.S. Cl.
CPC ....................................... *G03F 1/24* (2013.01)
(58) Field of Classification Search
CPC ........................................................ G03F 1/24
USPC ............................................................ 430/5
See application file for complete search history.

(56) References Cited

U.S. PATENT DOCUMENTS

| 8,828,626 B2 * | 9/2014 | Mikami ................... G03F 1/24 430/5 |
| 9,207,529 B2 * | 12/2015 | Kinoshita ................ G03F 1/24 |
| 2012/0231378 A1 | 9/2012 | Mikami et al. |

FOREIGN PATENT DOCUMENTS

| JP | 2004-333711 | 11/2004 |
| JP | 2006-93454 | 4/2006 |
| JP | 2013-122952 | 6/2013 |

* cited by examiner

*Primary Examiner* — Christopher Young
(74) *Attorney, Agent, or Firm* — Oblon, McClelland, Maier & Neustadt, L.L.P.

(57) ABSTRACT

To provide a process for producing an EUV mask blank, whereby mixing at each interface between layers constituting a Mo/Si multilayer reflective film during a step involving heating, is suppressed, and a process for producing a reflective layer-coated substrate to be used for the production of the EUV mask blank. A process for producing a reflective layer-coated substrate for EUV lithography (EUVL), which has a step of forming a Mo/Si multilayer reflective film by alternately forming a molybdenum (Mo) layer and a silicon (Si) layer on a film-forming surface of a substrate, wherein after forming each Si layer except for a Si layer as the uppermost layer among Si layers constituting the Mo/Si multilayer reflective film, the surface of such each Si layer is exposed to a nitrogen-containing atmosphere held in a plasma state without being exposed to the air atmosphere, and then, a Mo layer is formed.

20 Claims, 1 Drawing Sheet

REFLECTIVE MASK BLANK FOR EUV LITHOGRAPHY, OR REFLECTIVE LAYER-COATED SUBSTRATE FOR EUV LITHOGRAPHY, AND PROCESS FOR ITS PRODUCTION

BACKGROUND OF INVENTION

1. Field of Invention

The present invention relates to a reflective mask blank for EUV (Extreme Ultraviolet) lithography (hereinafter referred to also as "EUV mask blank" in this specification) to be used for e.g. production of semiconductors, and a process for its production. Further, the present invention relates to a reflective layer-coated substrate to be used for EUV lithography, particularly a reflective layer-coated substrate to be used for the production of the EUV mask blank, and a process for its production.

2. Discussion of Background

Heretofore, in the semiconductor industry, a photolithography method employing visible light or ultraviolet light has been used as a technique to transfer a fine pattern required to form an integrated circuit with a fine pattern on e.g. a silicon substrate. However, the conventional photolithography method has come close to its limit, while miniaturization of semiconductor devices is being accelerated. In the case of the photolithography method, the resolution limit of a pattern is about ½ of the exposure wavelength. Even if an immersion method is employed, the resolution limit is said to be about ¼ of the exposure wavelength, and even if an immersion method of ArF excimer laser (wavelength: 193 nm) is employed, about 45 nm is presumed to be the limit. Under the circumstances, as an exposure technique employing an exposure wavelength shorter than 45 nm, EUV lithography is expected to be prospective, which is an exposure technique employing EUV light having a wavelength further shorter than ArF excimer laser. In this specification, EUV light is meant for light ray having a wavelength within a soft X-ray region or within a vacuum ultraviolet region, specifically for light ray having a wavelength of from about 10 to 20 nm, particularly about 13.5 nm±0.3 nm.

EUV light is likely to be absorbed by all kinds of substances, and the refractive index of substances at such a wavelength is close to 1, whereby it is not possible to use a conventional refractive optical system like photolithography employing visible light or ultraviolet light. Therefore, in EUV lithography, a reflective optical system, i.e. a reflective photomask (EUV mask) and mirror, is employed.

A mask blank is a layered product before pattering, to be used for the production of a photomask. In the case of an EUV mask blank, it has a structure wherein a reflective layer to reflect EUV light and an absorber layer to absorb EUV light, are formed in this order on a substrate made of e.g. glass. As the reflective layer, it is common to use a Mo/Si multilayer reflective film having a molybdenum (Mo) layer as a layer to show a low refractive index to EUV light and a silicon (Si) layer as a layer to show a high refractive index to EUV light alternately stacked to have the light reflectivity improved when the layer surface is irradiated with EUV light.

For the absorber layer, a material having a high absorption coefficient to EUV light, specifically e.g. a material containing chromium (Cr) or tantalum (Ta) as the main component, is used.

In the production of an EUV mask blank or in the production of an EUV mask from an EUV mask blank, there is a step involving heating of the EUV mask blank. For example, cleaning by a chemical reaction by means of a chemical reagent in order to remove defects, cleaning by a mechanical energy by means of ultrasonic waves, inspection of defects by a laser, baking treatment in a patterning step, or thermal load by etching, corresponds to such a step. Further, the EUV mask will be heated also by exposure by means of EUV light at the time of carrying out EUV lithography.

During such a step involving heating, mixing may proceed at each interface between layers constituting a Mo/Si multilayer reflective film. If such mixing proceeds excessively at each interface between layers constituting a Mo/Si multilayer reflective film, the reflection characteristic during irradiation with EUV light, specifically the peak wavelength of reflected EUV light, will change, such being problematic (see Patent Document 1).

The change in the peak wavelength of reflected light is desired to be at most 0.04 nm, since it is a range wherein a precise wavelength control can be carried out in order to obtain wavelength specifications required for exposure. Here, in this specification, expressions "peak wavelength" and "center wavelength" will be used for description, and the center wavelength may be evaluated as the same index as the peak wavelength.

Therefore, in Patent Document 1, in order to prevent a change in the peak wavelength of reflected light by excessive progress of mixing, the temperature for heat treatment after forming the Mo/Si multilayer reflective film is controlled to be at most 160° C.

However, a step of heating at a higher temperature may sometimes be required for such a reason as e.g. cleaning at a high temperature for the purpose of improving the efficiency for removal of defects, thermal load by dry cleaning in vacuum, use of a high output laser for the purpose of improving the sensitivity in inspection of defects, baking treatment at a high temperature corresponding to the type of a resist to be used, increase in thermal load due to improvement in the etching rate, or use of high output EUV light for the purpose of high speed exposure.

With an EUV mask blank disclosed in Patent Document 2, it is said to be possible to effectively prevent mixing during heat treatment and to suppress the change in the peak wavelength to be at most 0.1 nm, by forming a diffusion preventive layer made of a material containing Mo and carbon (C) between a Mo layer and a Si layer constituting a Mo/Si multilayer reflective film.

However, the EUV mask blank disclosed in Patent Document 2 has a problem such that the diffusion preventive layer is formed by reactive sputtering by means of hydrocarbon gas between a Mo layer and a Si layer constituting a Mo/Si multilayer reflective film, whereby control of the composition or the film thickness tends to be complex, and the wavelength control with high precision or maintenance of the periodicity of the film thickness in the multilayer film tends to be difficult.

PRIOR ART DOCUMENTS

Patent Documents

Patent Document 1: JP-A-2013-122952
Patent Document 2: JP-A-2006-93454

SUMMARY OF INVENTION

Technical Problems

In order to solve the above problems, it is an object of the present invention to provide an EUV mask blank whereby mixing at each interface between layers constituting a Mo/Si multilayer reflective film during a step involving heating is suppressed and a process for its production, as well as a reflective layer-coated substrate to be used for EUV lithography, and a process for its production, particularly a reflective layer-coated substrate to be used for the production of the EUV mask blank, and a process for its production.

Solution to Problems

In order to accomplish the above object, the present invention provides a process for producing a reflective layer-coated substrate for EUV lithography (EUVL), which has a step of forming a Mo/Si multilayer reflective film by alternately forming a molybdenum (Mo) layer and a silicon (Si) layer on a film-forming surface of a substrate, wherein after forming each Si layer except for a Si layer as the uppermost layer among Si layers constituting the Mo/Si multilayer reflective film, the surface of such each Si layer is exposed to a nitrogen-containing atmosphere held in a plasma state without being exposed to the air atmosphere, and then, a Mo layer is formed.

In the process for producing a reflective layer-coated substrate for EUVL of the present invention, further, after forming a Si layer as the uppermost layer of the Mo/Si multilayer reflective film, the surface of the Si layer may be exposed to a nitrogen-containing atmosphere held in a plasma state without being exposed to the air atmosphere.

In the process for producing a reflective layer-coated substrate for EUVL of the present invention, further, after forming at least one Mo layer among Mo layers constituting the Mo/Si multilayer reflective film, the surface of such Mo layer may be exposed to a nitrogen-containing atmosphere held in a plasma state without being exposed to the air atmosphere, and then, a Si layer may be formed.

In the process for producing a reflective layer-coated substrate for EUVL of the present invention, the product of the nitrogen partial pressure (Torr) of the nitrogen-containing atmosphere and the exposure time (s) is preferably at least $1 \times 10^{-6}$ Torr·s.

The process for producing a reflective layer-coated substrate for EUVL of the present invention, may further have a step of forming a ruthenium (Ru) layer or a Ru compound layer as a protective layer on the Mo/Si multilayer reflective film.

Further, the present invention provides a process for producing a reflective mask blank for EUV lithography (EUVL), which has at least a step of forming a Mo/Si multilayer reflective film by alternately forming a molybdenum (Mo) layer and a silicon (Si) layer on a film-forming surface of a substrate, and a step of forming an absorber layer for absorbing EUV light on the Mo/Si multilayer reflective film, wherein after forming each Si layer except for a Si layer as the uppermost layer among Si layers constituting the Mo/Si multilayer reflective film, the surface of such each Si layer is exposed to a nitrogen-containing atmosphere held in a plasma state without being exposed to the air atmosphere, and then, a Mo layer is formed.

In the process for producing a reflective mask blank for EUVL of the present invention, further, after forming a Si layer as the uppermost layer of the Mo/Si multilayer reflective film, the surface of the Si layer may be exposed to a nitrogen-containing atmosphere held in a plasma state without being exposed to the air atmosphere.

In the process for producing a reflective mask blank for EUVL of the present invention, further, after forming at least one Mo layer among Mo layers constituting the Mo/Si multilayer reflective film, the surface of such Mo layer may be exposed to a nitrogen-containing atmosphere held in a plasma state without being exposed to the air atmosphere, and then, a Si layer may be formed.

In the process for producing a reflective mask blank for EUVL of the present invention, the product of the nitrogen partial pressure (Torr) of the nitrogen-containing atmosphere and the exposure time (s) is preferably at least $1 \times 10^{-6}$ Torr·s.

In the process for producing a reflective mask blank for EUVL of the present invention, after forming the absorber layer, heat treatment may be carried out at a temperature of from 110° C. to 160° C.

The process for producing a reflective mask blank for EUVL of the present invention may further have a step of forming a ruthenium (Ru) layer or a Ru compound layer as a protective layer on the Mo/Si multilayer reflective film.

The process for producing a reflective mask blank for EUVL of the present invention may have a step of forming, on the absorber layer, a low reflective layer to inspection light to be used for inspection of a mask pattern.

In the process for producing a reflective mask blank for EUVL of the present invention, after forming the low reflective layer, heat treatment may be carried out at a temperature of from 110° C. to 160° C.

Further, the present invention provides a reflective layer-coated substrate for EUVL, which has a Mo/Si multilayer reflective film having a Mo layer and a Si layer alternately stacked plural times on a substrate, and which has, between the Si layer and the Mo layer, a thin film containing from 0.5 to 25 at % of nitrogen and from 75 to 99.5 at % of Si and having a film thickness of from 0.2 to 2.0 nm.

In the reflective layer-coated substrate for EUVL of the present invention, the uppermost layer of the Mo/Si multilayer reflective film may be a Si layer, and the substrate may have, on the Si layer as the uppermost layer, a thin film containing from 0.5 to 25 at % of nitrogen and from 75 to 99.5 at % of Si and having a film thickness of from 0.2 to 2.0 nm.

The reflective layer-coated substrate for EUVL of the present invention may have, between the Mo layer and the Si layer, a thin film containing from 0.5 to 25 at % of nitrogen and from 75 to 99.5 at % of Mo and having a film thickness of from 0.2 to 2.0 nm.

The reflective layer-coated substrate for EUVL of the present invention may have, on the Mo/Si multilayer reflective film, a ruthenium (Ru) layer or a Ru compound layer as a protective layer to protect the Mo/Si multilayer reflective film.

Further, the present invention provides a reflective mask blank for EUVL having an absorber layer on the Mo/Si multilayer reflective film or on the protective layer of the Mo/Si multilayer reflective film of the reflective layer-coated substrate for EUVL of the present invention.

Further, the reflective mask blank for EUVL of the present invention may have, on the absorber layer, a low reflective layer to inspection light to be used for inspection of a mask pattern.

Advantageous Effects of Invention

According to the present invention, it is possible to obtain an EUV mask blank or a reflective layer-coated substrate for EUVL, whereby mixing at each interface between layers constituting a Mo/Si multilayer reflective film during a step involving heating is suppressed. With the EUV mask blank or the reflective layer-coated substrate for EUVL of the present invention, the decrease in the peak wavelength of reflected EUV light between before and after the step involving heating is at most 0.04 nm.

PREFERRED EMBODIMENTS OF INVENTION

Now, the present invention will be described with reference to the drawings.

Figure 1:
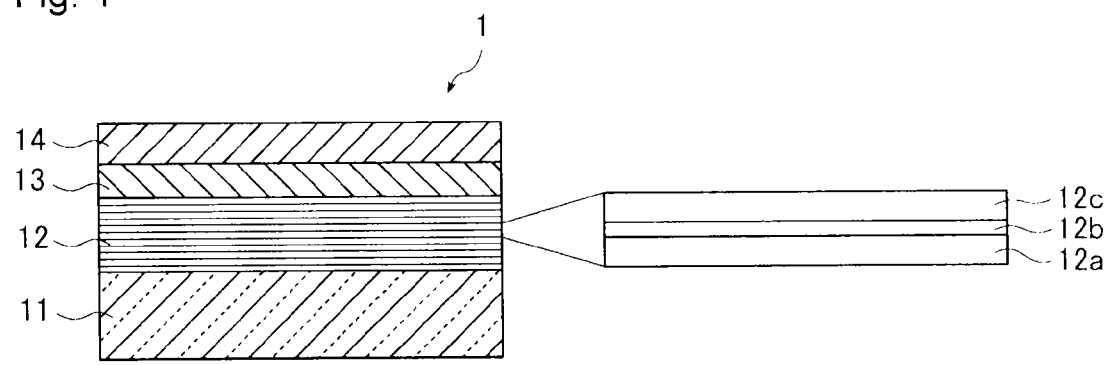
FIG. 1 is a schematic cross-sectional view illustrating one embodiment of the EUV mask blank of the present invention.

FIG. 1 is a schematic cross-sectional view illustrating one embodiment of the EUV mask blank to be produced by the process of the present invention. The mask blank 1 shown in FIG. 1 has a reflective layer 12 for reflecting EUV light and an absorber layer 14 for absorbing EUV light formed in this order on a substrate 11. As will be described in detail later, as the reflective layer 12, a Mo/Si multilayer reflective film is used wherein a Mo layer as a low refractive index layer showing a low refractive index to EUV light and a Si layer as a high refractive index layer showing a high refractive index to EUV light are alternately stacked plural times. However, (with respect to a Mo layer 12c on a Si layer 12a), between the Si layer 12a and the Mo layer 12c, a thin film 12b containing Si and N is formed.

Further, between the reflective layer 12 and the absorber layer 14, a protective layer 13 is formed for protecting the reflective layer 12 during formation of a pattern in the absorber layer 14.

Here, in the EUV mask blank of the present invention, in the construction as shown in FIG. 1, only the substrate 11, the reflective layer 12 and the absorber layer 14 are essential, and the protective layer 13 is an optional constituting element.

Now, individual constituting elements of the mask blank 1 will be described.

The substrate 11 is required to satisfy the properties as a substrate for an EUV mask blank.

Therefore, the substrate 11 is preferably one having a low thermal expansion coefficient (preferably $0\pm1.0\times10^{-7}/°$ C., more preferably $0\pm0.3\times10^{-7}/°$ C., further preferably $0\pm0.2\times10^{-7}/°$ C., still further preferably $0\pm0.1\times10^{-7}/°$ C., particularly preferably $0\pm0.05\times10^{-7}/°$ C.) and being excellent in smoothness, flatness and durability against a cleaning liquid to be used for e.g. cleaning of a mask blank or a photomask after forming a pattern. Specifically, as the substrate 11, glass having a low thermal expansion coefficient, such as $SiO_2$—$TiO_2$ type glass, may be used. However, the substrate is not limited thereto, and it is possible to employ a substrate of e.g. crystallized glass having β-quartz solid solution precipitated, quartz glass, silicon or metal. Further, a film such as a stress correcting film may also be formed on the substrate 11.

The substrate 11 preferably has a smooth surface having a surface roughness of at most 0.15 nm rms and a flatness of at most 100 nm, whereby a high EUV reflectivity and transfer precision can be attained by a photomask after forming a pattern.

The size, thickness, etc. of the substrate 11 may suitably be determined depending upon e.g. the designed values for the mask. In Examples given hereinafter, $SiO_2$—$TiO_2$ type glass having a size of 6 inch (152.4 mm) square and a thickness of 0.25 inch (6.3 mm) was used.

It is preferred that no defect is present on the surface of the substrate 11 on the side where a reflective layer 12 is to be formed. However, even in a case where a defect is present, in order not to cause a phase defect due to a concave defect and/or a convex defect, it is preferred that the depth of the concave defect or the height of the convex defect is not more than 2 nm, and the half value width of such a concave defect or convex defect is not more than 60 nm.

The property particularly required for the reflective layer 12 of the EUV mask blank is a high EUV reflectivity. Specifically, when a light ray within the wavelength region of EUV light is applied at an incident angle of 6° to the surface of the reflective layer 12, the maximum value of the reflectivity of the light ray in the vicinity of a wavelength of 13.5 nm (hereinafter referred to as "EUV reflectivity") may be at least 60%, preferably at least 63%, more preferably at least 65%. Further, even in a case where a protective layer 13 is formed on the reflective layer 12, the maximum value of the EUV reflectivity may be at least 60%, preferably at least 63%, more preferably at least 65%.

As mentioned above, it is preferred to employ a Mo/Si multilayer reflective film as the reflective layer for the EUV mask blank.

In the case of a Mo/Si multilayer reflective film, in order to obtain a reflective layer which satisfies the maximum value of the EUV reflectivity being at least 60%, it is usual that a Mo layer having a thickness of 2.3±0.1 nm and a Si layer having a thickness of 4.5±0.1 nm are alternately stacked repeatedly so that the number of repeating units would be from 30 to 60.

In the present invention, as described later, the reflective layer has a thin film containing Si and N on the surface of a Si layer, or it has a thin film containing Si and N on the surface of a Si layer and, at the same time, has a thin film containing Mo and N on the surface of a Mo layer. In this specification, a multilayer reflective film having such a construction will be referred to also as a "Mo/Si multilayer reflective film".

Here, the respective layers constituting the Mo/Si multilayer reflective film may be formed to have desired thicknesses by means of a known film-forming method such as a magnetron sputtering method or an ion beam sputtering method. For example, in the case of forming a Mo/Si multilayer reflective film by means of an ion beam sputtering method, it is usually preferred that a Mo layer is formed to have a thickness of 2.3 nm at an ion accelerating voltage of from 300 to 1,500 V and a film-deposition rate of from 0.03 to 0.30 nm/sec. by using a Mo target as the target and an Ar gas (gas pressure: from $1.3\times10^{-2}$ Pa to $2.7\times10^{-2}$ Pa) as the sputtering gas, and then, a Si layer is formed to have a thickness of 4.5 nm at an ion accelerating voltage of from 300 to 1,500 V and a film-deposition rate of from 0.03 to 0.30 nm/sec. by using a Si target as the target and an Ar gas (gas pressure: from $1.3\times10^{-2}$ Pa to $2.7\times10^{-2}$ Pa) as the sputtering gas. When this operation is taken as one cycle, the Mo/Si multilayer reflective layer is formed by stacking the Mo layer and the Si layer by from 30 to 60 cycles while paying due attention to the after-mentioned points.

As mentioned above, if mixing proceeds excessively at each interface between layers constituting the Mo/Si multilayer reflective film by e.g. a step involving heating which is carried out during the production of an EUV mask blank or at the time of producing a photomask from an EUV mask blank, the reflection property during irradiation with EUV light, specifically the peak wavelength of reflected EUV light, decreases, thus leading to a problem. The mixing at each interface between layers constituting the Mo/Si multilayer reflective film is such a phenomenon that some of elements constituting the Mo layer and the Si layer constituting the Mo/Si multilayer reflective film are mutually diffused between adjacent layers to form a layer containing Mo and Si at the interface between the Mo layer and the Si layer, whereby film shrinkage will take place, and the total film thickness of the Mo layer and the Si layer will slightly decrease. As a result, the peak wavelength of the reflected EUV light will decrease.

In the present invention, after forming each Si layer except for a Si layer as the uppermost layer among Si layers constituting the Mo/Si multilayer reflective film, the surface of such each Si layer is exposed to a nitrogen-containing atmosphere held in a plasma state without being exposed to the air atmosphere, and then, a Mo layer is formed, whereby the progress of mixing is suppressed at the interface between layers constituting the Mo/Si multilayer reflective film.

When, after forming a Si layer, the Si layer surface is exposed to a nitrogen-containing atmosphere held in a plasma state without being exposed to the air atmosphere, reaction-activated nitrogen dissociated, excited or ionized in the plasma will be in contact with the Si layer surface, whereby nitriding of the Si layer surface will be accelerated. Thus, as shown in FIG. 1, a thin film 12b containing Si and N will be formed on the Si layer 12a. Then, a Mo layer 12c will be formed on the thin film 12b.

Here, if the Si layer surface is exposed to a nitrogen-containing atmosphere which is not held in a plasma state, nitriding of the Si layer surface will be very limited, and the progress of mixing at the interface between layers constituting the Mo/Si multilayer reflective film cannot be suppressed.

As another method for suppressing the mixing, after forming each Si layer except for a Si layer as the uppermost layer among Si layers constituting the Mo/Si multilayer reflective film, the surface of such each Si layer may be exposed to a hydrocarbon-containing atmosphere held in a plasma state without being exposed to the air atmosphere, and then, a Mo layer is formed, thereby to suppress the progress of mixing at the interface between layers constituting the Mo/Si multilayer reflective film. In this case, carbonization of the Si layer surface will be accelerated, and a thin film containing Si and C will be formed on the Si layer. The hydrocarbon is preferably of a low molecular weight, since it is thereby easily utilized as a gas, and it is possible to avoid formation of contaminants by polymerization, and, for example, methane gas is preferred. Further, as another gas, carbon dioxide or oxygen may be employed to accelerate carbonization or oxidation of the Si layer surface and thereby to suppress the progress of mixing.

However, the above-mentioned formation of a thin film containing Si and N is preferred in that nitrogen gas as simple element is employed, and control of the composition and the film thickness during formation of the thin film is easy.

The reason why the progress of mixing at the interface between layers constituting the Mo/Si multilayer reflective film can be suppressed by forming a thin film 12b containing Si and N between the Si layer 12a and the Mo layer 12c, is such that in the thin film 12b, Si and N are firmly bonded so as to suppress mutual diffusion, via the thin film 12b, of some of elements constituting the Si layer 12a and the Mo layer 12c.

Here, the thin film 12b containing Si and N has a film thickness being so thin as described later that there will be no such a drawback that the EUV reflectivity will substantially decrease due to formation of the thin film 12b.

If the degree of the effect to suppress the progress of mixing at the interface between the above layers may be disregarded, such an effect itself may be obtainable by forming a thin film 12b containing Si and N only at any one interface among interfaces between Si layers 12a and Mo layers 12c constituting the Mo/Si multilayer reflective film.

However, in the present invention, the change in the peak wavelength of reflected EUV light due to the progress of mixing, i.e. the decrease in the peak wavelength of reflected EUV light between before and after the step involving heating, is to be made to be at most 0.04 nm, and therefore, if the thin film 12b containing Si and N is formed only at some interfaces among all interfaces between Si layers 12a and Mo layers 12c constituting the Mo/Si multilayer reflective film, mixing will proceed at the rest of interfaces, whereby the effect to suppress the progress of mixing tends to be correspondingly deficient.

Further, if the thin film 12b containing Si and N is formed only at some interfaces among all interfaces between Si layers 12a and Mo layers 12c constituting the Mo/Si multilayer reflective film, it may be required to make periodic length uniform for the Mo/Si multilayer reflective film between the portions where the thin film 12b containing Si and N is formed and other portions, and there may be case where it becomes difficult to adjust the periodic length of the entire Mo/Si multilayer reflective film.

Therefore, in the present invention, the thin film 12b containing Si and N is formed at every interface between Si layers 12a and Mo layers 12c constituting the Mo/Si multilayer reflective film.

To realize this construction, after forming each Si layer except for a Si layer as the uppermost layer among Si layers constituting the Mo/Si multilayer reflective film, the surface of such each Si layer is exposed to a nitrogen-containing atmosphere without being exposed to the air atmosphere, and then a Mo layer is formed.

Here, the reason for excluding a Si layer as the uppermost layer is such that its relevancy to suppression of the progress of mixing at the interface between layers constituting the Mo/Si multilayer reflective film is low. However, in a case where a thin film containing Si and N is formed on the Si layer as the uppermost layer, it is possible to obtain the same effect as the invention disclosed in WO2011/071123, i.e. the effect to suppress oxidation of the Si layer as the uppermost layer or to suppress oxidation from a film formed above the Mo/Si multilayer reflective film (i.e. in a case where a protective layer for the Mo/Si multilayer reflective film is formed on the Mo/Si multilayer reflective film, the protective film).

Therefore, also with respect to the Si layer as the uppermost layer, it is preferred that after forming the Si layer, the surface of the Si layer is exposed to a nitrogen-containing atmosphere without being exposed to the air atmosphere, to form a thin film containing Si and N on the Si layer.

In the present invention, the composition of the thin film 12b containing Si and N to be formed on a Si layer 12a is not particularly limited, but such a thin film 12b preferably contains from 0.5 to 25 at % of N and from 75 to 99.5 at % of Si. The N content in the thin film 12b being at least 0.5 at % is preferred in order to obtain the effect to suppress the progress of mixing at the interface between layers constituting the Mo/Si multilayer reflective film. On the other hand, the N content in the thin film 12b being at most 25 at % is preferred in that a decrease in the EUV reflectivity due to formation of the thin film 12b is thereby less likely to occur.

The thin film 12b more preferably contains from 0.5 to 15 at % of N and from 85 to 99.5 at % of Si, further preferably contains from 0.5 to 10 at % of N and from 90 to 99.5 at % of Si, still further preferably contains from 1 to 9 at % of N and from 91 to 99 at % of Si, still more preferably contains from 3 to 9 at % of N and from 91 to 97 at % of Si, particularly preferably contains from 5 to 8 at % of N and from 92 to 95 at % of Si.

In the present invention, the thickness of the thin film 12b containing Si and N to be formed on the Si layer 12a is not particularly limited, but the thickness of the thin film 12b is preferably from 0.2 to 2.0 nm. The thickness of the thin film 12b being at least 0.2 nm is preferred in order to obtain the effect to suppress the progress of mixing at the interface between layers constituting the Mo/Si multilayer reflective film. On the other hand, the thickness of the thin film 12b being at most 2.0 nm is preferred in that a decrease in the EUV reflectivity is thereby small.

The thickness of the thin film 12b is more preferably from 0.3 to 1.5 nm, further preferably from 0.4 to 1.2 nm.

As an interface between layers constituting the Mo/Si multilayer reflective film, in addition to the interface between a Si layer 12a and a Mo layer 12c as shown in FIG. 1, there exists an interface between a Mo layer and a Si layer. In the present invention, the reason for forming the thin film 12b containing Si and N at the interface between a Si layer 12a and a Mo layer 12c (the Mo layer 12c on the Si layer 12a) is such that Mo having a larger atomic weight is more readily diffusible into the Si layer at the time of forming the thin film by means of a magnetron sputtering method or an ion beam sputtering method.

However, in the present invention, a thin film containing Mo and N may further be formed at an interface between a Mo layer and a Si layer (the Si layer on the Mo layer). By forming the thin film containing Mo and N at the interface between the Mo layer and the Si layer, an improvement is expected in the effect to suppress the progress of mixing at the interface between layers constituting the Mo/Si multilayer reflective film. In order to form the thin film containing Mo and N at the interface between the Mo layer and the Si layer, after forming the Mo layer, the surface of the Mo layer is exposed to a nitrogen-containing atmosphere without being exposed to the air atmosphere, so that the surface of the Mo layer will be nitrided. Thus, a thin film containing Mo and N will thereby be formed on the Mo layer. Further, a Si layer is formed on the thin film, so that the thin film containing Mo and N is formed at the interface between the Mo layer and the Si layer. When the thin film containing Mo and N is to be formed at the interface between the Mo layer and the Si layer, the thin film containing Mo and N may be formed at only one interface among interfaces between the Mo layers and the Si layers constituting the Mo/Si multilayer reflective film, or the thin film may be formed at two or more interfaces. With a view to obtaining the effect to suppress the progress of mixing, it is preferred to form the thin film containing Mo and N at every interface between the Mo layers and the Si layers.

In the present invention, when the thin film containing Mo and N is to be formed at the interface between a Mo layer and a Si layer (the Si layer on the Mo layer), the composition of the thin film is not particularly limited, but the thin film preferably contains from 0.5 to 25 at % of N and from 75 to 99.5 at % of Mo. The N content in the thin film being at least 0.5 at % is preferred in order to obtain the effect to suppress the progress of mixing at the interface between layers constituting the Mo/Si multilayer reflective film. On the other hand, the N content in the thin film being at most 25 at % is preferred, since a decrease in the EUV reflectivity due to formation of the thin film is thereby less likely to occur.

The thin film more preferably contains from 0.5 to 15 at % of N and from 85 to 99.5 at % of Mo, further preferably contains from 0.5 to 10 at % of N and from 90 to 99.5 at % of Mo, still further preferably contains from 1 to 9 at % of N and from 91 to 99 at % of Mo still more preferably contains from 3 to 9 at % of N and from 91 to 97 at % of Mo, particularly preferably contains from 5 to 8 at % of N and from 92 to 95 at % of Mo.

In the present invention, when the thin film containing Mo and N is to be formed at the interface between a Mo layer and a Si layer (the Si layer on the Mo layer), the thickness of the thin film is not particularly limited, but the thickness of the thin film is preferably from 0.2 to 2.0 nm. The thickness of the thin film being at least 0.2 nm is preferred in order to obtain the effect to suppress the progress of mixing at the interface between layers constituting the Mo/Si multilayer reflective film. On the other hand, the thickness of the thin film being at most 2.0 nm is preferred in that a decrease in the EUV reflectivity is thereby small.

The thickness of the thin film is more preferably from 0.3 to 1.8 nm, further preferably from 0.4 to 1.6 nm.

In the present invention, the nitrogen-containing atmosphere to which the Si layer surface or the Mo layer surface is to be exposed, means a nitrogen gas atmosphere or a mixed gas atmosphere of nitrogen gas and inert gas such as argon. In the case of the mixed gas atmosphere, the nitrogen gas content in the atmosphere is preferably at least 20 vol %, more preferably at least 50 vol %.

In the present invention, the product of the nitrogen partial pressure (Torr) of the nitrogen-containing atmosphere and the exposure time (s) is preferably at least $1 \times 10^{-6}$ Torr·s (=1 L (Langmuir). In a case where the nitrogen partial pressure is represented by Pa, the product of the nitrogen partial pressure (Pa) of the nitrogen-containing atmosphere and the exposure time (s) would be preferably at least $1.33 \times 10^{-4}$ Pa·s.

The product of the nitrogen partial pressure and the exposure time is an index showing the frequency of collisions of nitrogen in the nitrogen-containing atmosphere to the Si layer surface or the Mo layer surface, and may sometimes referred to as "the nitrogen exposure amount" hereinafter in this specification. In order to nitride the Si layer surface or the Mo layer surface to form a thin film containing Si and N or a thin film containing Mo and N, this value is preferably at least $1 \times 10^{-6}$ Torr·s (at least $1.33 \times 10^{-4}$ Pa·s), more preferably at least $1 \times 10^{-3}$ Torr·s (at least $1.33 \times 10^{-1}$ Pa·s), further preferably at least $1 \times 10^{-2}$ Torr·s (at least 1.33 Pa·s).

Further, the nitrogen partial pressure in the nitrogen-containing atmosphere to which the Si layer surface or the Mo layer surface is to be exposed, is preferably from $1 \times 10^{-4}$ Torr to 820 Torr (from $1.33 \times 10^{-2}$ Pa to 109.32 kPa).

Here, in a case where the nitrogen-containing atmosphere is a nitrogen gas atmosphere, the above nitrogen partial pressure is meant for the atmosphere pressure of the nitrogen gas atmosphere.

In the present invention, the temperature of the nitrogen-containing atmosphere to which the Si layer surface or the Mo layer surface is to be exposed, is not particularly limited. For example, the substrate temperature under the nitrogen-containing atmosphere may be adjusted to be within a temperature range of from about room temperature to maintain the film-forming device to about a temperature raised at the time of film-deposition on the substrate surface.

As mentioned above, in the present invention, the Si layer surface or the Mo layer surface is exposed to the nitrogen-containing atmosphere held in a plasma state. The method for maintaining the nitrogen-containing atmosphere in a plasma state may suitably selected depending upon the film-forming method to be used for forming the Si layer or the Mo layer. For example, in the case of employing an ion beam sputtering method as the film-forming method, RF discharge can be utilized. On the other hand in the case of employing a DC magnetron sputtering method, in addition to discharge for sputtering, DC discharge or RF discharge may be prepared to hold the plasma state.

However, even in such a case, if a voltage is applied to nitrogen gas (or a mixed gas of nitrogen gas and inert gas such as argon) ionized in a plasma state to irradiate the Si layer surface or the Mo layer surface with ions, ionized nitrogen will collide in an accelerated state to the Si layer surface or the Mo layer surface, whereby nitriding of the Si layer surface or the Mo layer surface is likely to excessively proceed thereby to cause a decrease in the EUV reflectivity of the Mo/Si multilayer reflective film. Therefore, it is preferred not to apply a voltage to nitrogen gas (or a mixed gas of nitrogen gas and inert gas such as argon) ionized in a plasma state, i.e. not to apply irradiation with ions, in that it is thereby possible to control, properly and with good reproducibility, the nitrogen amount and the film thickness of the thin film containing Si and N or a thin film containing Mo and N.

In Examples given hereinafter, the time for exposing the Si layer surface or the Mo layer surface to the nitrogen-containing atmosphere is set to be 60 sec. or 600 sec., respectively, but the time for exposing the Si layer surface or the Mo layer surface to the nitrogen-containing atmosphere is not limited thereto and may suitably be selected within the range to satisfy the above mentioned conditions relating to the nitrogen-containing atmosphere.

As in the procedure shown in Examples given hereinafter, the procedure to expose the Si layer surface or the Mo layer surface under a reduced pressure atmosphere to nitrogen gas or a mixed gas of nitrogen gas and inert gas such as argon is a preferred procedure when it is taken into consideration that it is important to discharge the nitrogen gas (or the mixed gas of nitrogen gas and inert gas such as argon) from the chamber after carrying out the procedure of exposing the Si layer surface or the Mo layer surface to the nitrogen gas (or the mixed gas of nitrogen gas and inert gas such as argon) and before carrying out formation of a Mo layer or a Si layer in a case where the formation of the Si layer and the formation of the Mo layer are carried out by using the same chamber. Further, this procedure is a preferred procedure also from such a viewpoint that it is possible to control the nitrogen content in the thin film containing Si and N, or in the thin film containing Mo and N, by controlling the exposure amount of the nitrogen gas (or the mixed gas of nitrogen gas and inert gas such as argon) to the Si layer surface or the Mo layer surface.

The protective layer 13 is an optional constituting element to be provided for the purpose of protecting the reflective layer 12, so that at the time of forming a pattern in an absorber layer 14 usually by a dry etching process, the reflective layer 12 will not be damaged by the etching process. However, with a view to protecting the reflective layer 12, it is preferred to form the protective layer 13 on the reflective layer 12.

As the material for the protective layer 13, a material hardly susceptible to an influence by the etching process of the absorber layer 14 i.e. having an etching rate slower than the absorber layer 14 and hardly susceptible to damage by such an etching process, is selected for use.

Further, the protective layer 13 itself preferably has a high EUV reflectivity in order not to impair the EUV reflectivity at the reflective layer even after forming the protective layer 13.

The protective layer 13 is preferably a metal layer of a platinum group such as ruthenium (Ru), rhodium (Rh), palladium (Pd), osmium (Os), iridium (Ir) or platinum (Pt), or a compound layer containing such metal, since the above conditions are thereby satisfied. Among them, it is particularly preferred to form a Ru layer or a Ru compound (such as RuB or RuZr) layer. In a case where a Ru compound layer is to be formed as the protective layer 13, the content of Ru in the protective layer 13 is preferably at least 50 at %, more preferably at least 70 at %.

In a case where a protective layer 13 is formed on the reflective layer 12, the surface roughness of the surface of the protective layer 13 is preferably at most 0.5 nm rms. Here, in this specification, the surface roughness is represented by root-mean-square roughness Rq (old RMS) according to JIS-B0601. If the surface roughness of the surface of the protective layer 13 is large, the surface roughness of the absorber layer 14 to be formed on the protective layer 13 tends to be large, whereby the edge roughness of a pattern to be formed on the absorber layer 14 tends to be large, and the dimensional precision of the pattern tends to be poor. As the pattern becomes fine, the influence of the edge roughness becomes distinct, and therefore, the surface of the absorber layer 14 is required to be smooth.

When the surface roughness of the surface of the protective layer 13 is at most 0.5 nm rms, the surface of the absorber layer 14 to be formed on the protective layer 13 will be sufficiently smooth, thus being free from deterioration of the dimensional precision of a pattern due to an influence of the edge roughness. The surface roughness of the surface of the protective layer 13 is more preferably at most 0.4 nm rms, further preferably at most 0.3 nm rms.

In the case of forming a protective layer 13 on the reflective layer 12, the thickness of the protective layer 13 is preferably from 1 to 6 nm in that it is thereby possible to increase the EUV reflectivity and to obtain an etching resistance property. The thickness of the protective layer 13 is more preferably from 1.5 to 5 nm, further preferably from 2 to 4 nm.

In the case of forming a protective layer 13 on the reflective layer 12, the protective layer 13 can be formed by means of a well-known film-forming method such as a magnetron sputtering method or an ion beam sputtering method.

In a case where a Ru layer is to be formed by means of an ion beam sputtering method, discharge may be made in an argon (Ar) atmosphere by using a Ru target as the target. Specifically, the ion beam sputtering may be carried out under the following conditions.

Sputtering gas: Ar (gas pressure: from $1.3 \times 10^{-2}$ Pa to $2.7 \times 10^{-2}$ Pa)

Ion accelerating voltage: from 300 to 1,500 V

Film-forming rate: from 0.03 to 0.3 nm/sec.

Here, the state before forming the absorber layer of the EUV mask blank to be produced by the present invention, i.e. the structure having the absorber layer 14 excluded from the mask blank 1 shown in FIG. 1, is a reflective layer-coated substrate, and is one constituting a precursor for an EUV mask blank. However, the reflective layer-coated substrate for EUVL of the present invention is not limited to a precursor for an EUV mask blank and may generally be considered to include an optical substrate having a function to reflect EUV light.

The property particularly required for the absorber layer 14 of an EUV mask blank is that the EUV reflectivity is very low. Specifically, the maximum light reflectivity in the vicinity of a wavelength of 13.5 nm at the time of irradiating the surface of the absorber layer 14 with EUV light, is preferably at most 2.0%, more preferably at most 1.0%.

In order to attain the above property, the absorber layer 14 is preferably made of a material having a high absorption coefficient of EUV light and is preferably formed of a material containing tantalum (Ta) as the main component.

As such an absorber layer 14, a film containing TaN or TaBN as the main component may particularly be exemplified. As another example, one (a TaBSiN film) containing Ta, B, Si and nitrogen (N) in the following ratio may be mentioned.

Content of B: at least 1 at % and at most 5 at %, preferably from 1 to 4.5 at %, more preferably from 1.5 to 4 at %

Content of Si: from 1 to 25 at %, preferably from 1 to 20 at %, more preferably from 2 to 12 at %

Compositional ratio (atomic ratio) of Ta to N (Ta:N): from 8:1 to 1:1

Content of Ta: preferably from 50 to 90 at %, more preferably from 60 to 80 at %

Content of N: preferably from 5 to 30 at %, more preferably from 10 to 25 at %

The absorber layer 14 with the above composition is amorphous in its crystal state and excellent in its surface smoothness.

The absorber layer 14 with the above composition preferably has a surface roughness rms of at most 0.5 nm. If the surface roughness of the surface of the absorber layer 14 is large, the edge roughness of a pattern to be formed on the absorber layer 14 becomes large, whereby the dimensional precision of the pattern becomes deteriorated. As the pattern becomes fine, the influence of the edge roughness becomes distinct, and therefore, the surface of the absorber layer 14 is required to be smooth.

When the surface roughness rms of the surface of the absorber layer 14 is at most 0.5 nm, the surface of the absorber layer 14 is sufficiently smooth, and there will be no deterioration in the dimensional precision of the pattern due to an influence of the edge roughness. The surface roughness rms of the surface of the absorber layer 14 is more preferably at most 0.4 nm, further preferably at most 0.3 nm.

With the above construction, the absorber layer 14 has a high etching rate at the time when dry etching is carried out by using a chlorine-type gas as the etching gas, and shows an etching selectivity of at least 10 to the protective layer 13 (specifically the Ru layer or the Ru compound layer).

Here, in a case where no protective layer 13 is formed on the reflective layer 12, the absorber layer 14 shows an etching selectivity of at least 10 to the reflective layer 12 (specifically the Si layer as the uppermost layer of the Mo/Si multilayer reflective film). In this specification, the etching selectivity is calculated by using the following formula.

Etching selectivity=(etching rate of absorber layer 14)/(etching rate of protective layer 13 (or reflective layer 12)

The etching selectivity is preferably at least 10, more preferably at least 11, further preferably at least 12.

The thickness of the absorber layer 14 is preferably from 50 to 100 nm. The absorber layer 14 with the above-described construction can be formed by means of a film-forming method e.g. a sputtering method such as a magnetron sputtering method or an ion beam sputtering method.

In the process of the present invention, after forming the absorber layer 14 by the above-described procedure, the EUV mask blank may be subjected to heat treatment at a temperature of from 110° C. to 160° C.

By this heat treatment, structural relaxation of the respective layers constituting the Mo/Si multilayer reflective film is accelerated. And, by the acceleration of the structural relaxation, the film stress of the Mo/Si multilayer reflective film will be relaxed. Further, by the acceleration of the structural relaxation, the change with time of the stress of the Mo/Si multilayer reflective film will be suppressed.

Here, the specific temperature for the heat treatment may be adjusted within a range of from 110° C. to 160° C. so that a desired level of stress relaxation is obtainable. If the heat treatment temperature is lower than 110° C., the effect to relax the film stress by the structural relaxation in the Mo/Si multilayer reflective film tends to be inadequate.

On the other hand, if the heat treatment temperature is higher than 160° C., the progress of mixing in the Mo/Si multilayer reflective film tends to be dominant to the progress of the structural relaxation, whereby the respective layers of the multilayer reflective film tend to shrink, and it becomes difficult to obtain the main effect for relaxation of the film stress. The temperature for the heat treatment is more preferably from 130° C. to 150° C., further preferably from 136° C. to 144° C.

Further, the heating time is preferably within a range of from 5 to 60 minutes, more preferably within a range of from 10 to 30 minutes. If the time for the heat treatment is shorter than 5 minutes, the effect to relax the film stress by the structural relaxation in the Mo/Si multilayer reflective film is likely to be inadequate. On the other hand, if the time for the heat treatment is longer than 60 minutes, the effect to relax the film stress by the structural relaxation in the Mo/Si multilayer reflective film tends to be saturated, whereby the treating time tends to be long and the productivity tends to decrease.

In the present invention, the heat treatment after forming the absorber layer can be carried out in vacuum or in the air atmosphere. It is preferred to carry out the heat treatment in the air atmosphere, since the treatment can be simply conducted without requiring a safety measure against suffocation at the time of handling a gas other than air, such as nitrogen gas in the atmosphere.

Figure 2:
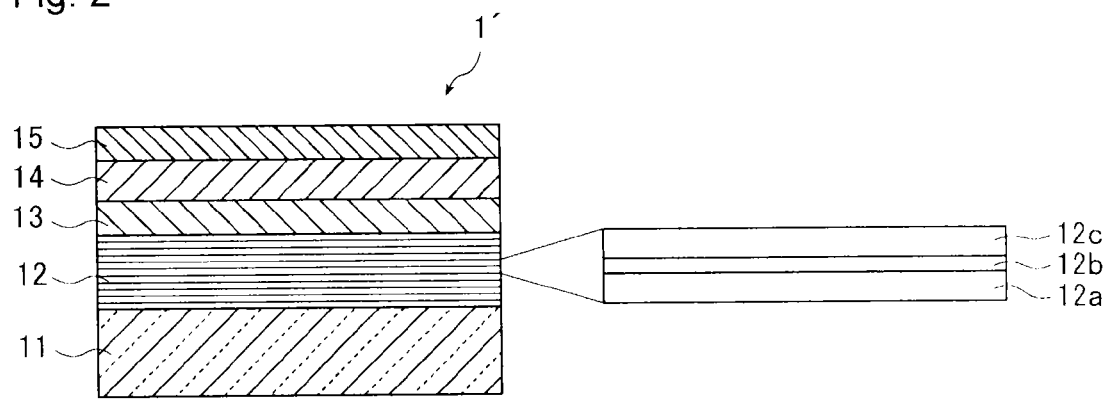
FIG. 2 is a schematic cross-sectional view illustrating another embodiment of the EUV mask blank of the present invention.

As in the EUV mask blank 1' shown in FIG. 2, in the EUV mask blank to be produced by the process of the present invention, a low reflective layer 15 to inspection light to be used for inspection of a mask pattern may be formed on the absorber layer 14.

In the preparation of an EUV mask, after forming a pattern in the absorber layer, inspection is carried out to see that this pattern is formed as designed. In this inspection of the mask pattern, an inspection machine using light of about 257 nm as inspection light, is usually employed. That is, the inspection is made by the difference in reflectivity of such light of about 257 nm, specifically by the difference in reflectivity between a surface exposed by removal of the absorber layer 14 by patterning and the surface of the absorber layer 14 remained without being removed by the patterning. Here, the former is the surface of the protective layer 13, and in a case where no protective layer 13 is formed on the reflective layer 12, it is the surface of the reflective layer 12 (specifically the surface of the Si layer as the uppermost layer of the Mo/Si multilayer reflective film). Therefore, if the difference in reflectivity between the protective layer 13 surface (or the reflective layer 12 surface) and the absorber layer 14 surface to the wavelength of inspection light of about 257 nm, is small, the contrast at the time of the inspection becomes poor, and an accurate inspection may not be possible.

The absorber layer 14 with the above-described construction has an extremely low EUV reflectivity and thus has an excellent property as an absorber layer for an EUV mask blank, but with respect to the wavelength of inspection light, the light reflectivity may not necessarily be sufficiently low. As a result, the difference between the reflectivity at the absorber layer 14 surface and the reflectivity at the protective layer 13 surface at the wavelength of inspection light, tends to be small, and the contrast at the time of the inspection may not be sufficiently obtainable. If the contrast at the time of the inspection cannot be sufficiently obtained, a defect in the pattern cannot be sufficiently detected in the inspection of a mask and at the protective layer 13 surface (or the reflective layer 12 surface), and an accurate inspection of a defect may not be carried out.

Like in the EUV mask blank 1' shown in FIG. 2, by forming a low reflective layer 15 on the absorber layer 14, the contrast at the time of the inspection will be good. In other words, the light reflectivity at the wavelength of inspection light becomes very low. With the low reflective layer 15 to be formed for such a purpose, the maximum light reflectivity at the wavelength of inspection light when irradiated with light in the wavelength region of inspection light is preferably at most 15%, more preferably at most 10%, further preferably at most 5%.

When the light reflectivity at the wavelength of inspection light at the low reflective layer 15 is at most 15%, the contrast at the time of the inspection will be good.

In this specification, the contrast can be obtained by using the following formula.

Contrast(%)=(($R_2$−$R_1$)/($R_2$+$R_1$))×100

Here, at the wavelength of inspection light, $R_2$ is the reflectivity at the protective 13 surface (or the reflective layer 12 surface), and $R_1$ is the reflectivity at the surface of the low reflective layer 15. Here, the above $R_1$ and $R_2$ are measured in such a state that a pattern is formed in the absorber layer 14 and the low reflective layer 15 of the EUV reflective mask blank 1' shown in FIG. 2. The above $R_2$ is a value measured at the protective layer 13 surface (or the reflective layer 12 surface) exposed by removal of the absorber layer 14 and the low reflective layer 15 by patterning, and $R_1$ is a value measured at the surface of the low reflective layer 15 remained without being removed by patterning.

In the present invention, the contrast represented by the above formula is more preferably at least 45%, further preferably at least 60%, particularly preferably at least 80%.

To attain the above-described properties, the low reflective layer 15 is preferably constituted by a material having a refractive index lower than the absorber layer 14 at the wavelength of inspection light, and its crystal state is preferably amorphous.

As a specific example of such a low reflective layer 15, a layer containing Ta and oxygen as the main components is preferred, and particularly, a layer containing TaON or TaBON as the main component may be exemplified. As another example, a layer containing TaBSiO or TaBSiON as the main component may be exemplified.

With the above-described construction, the low reflective layer (TaON, TaBON, TaBSiO or TaBSiON) is amorphous in its crystal state, and its surface is excellent in smoothness. Specifically, the surface roughness of the surface of the low reflective layer may be at most 0.5 nm rms.

As mentioned above, the surface of the absorber layer 14 is required to be smooth in order to prevent deterioration in the dimensional precision of a pattern due to an influence of an edge roughness. The low reflective layer 15 is formed on the absorber layer 14 and accordingly, for the same reason, its surface is required to be smooth.

When the surface roughness of the low reflective layer 15 surface is at most 0.5 nm rms, the low reflective layer 15 surface is sufficiently smooth and thus is free from deterioration in the dimensional precision of a pattern due to an influence of an edge roughness. The surface roughness of the low reflective layer 15 surface is more preferably at most 0.4 nm rms, further preferably at most 0.3 nm rms.

In a case where the low reflective layer 15 is to be formed on the absorber layer 14, the total thickness of the absorber layer 14 and the low reflective layer 15 is preferably from 51 to 130 nm. Further, if the thickness of the low reflective layer 15 is thicker than the thickness of the absorber layer 14, the EUV light absorption property at the absorber layer 14 is likely to deteriorate, and therefore, the thickness of the reflective layer 15 is preferably thinner than the thickness of the absorber layer 14. For this reason, the thickness of the low reflective layer 15 is preferably from 1 to 30 nm, more preferably from 2 to 20 nm.

The low reflective layer (TaON, TaBON, TaBSiO or TaBSiON) can be formed by using a film-forming method e.g. a sputtering method such as a magnetron sputtering method or an ion beam sputtering method.

Here, the reason why it is preferred to form a low reflective layer 15 on the absorber layer 14 as in the EUV mask blank 1' shown in FIG. 2, is that the wavelength of inspection light for a pattern is different from the wavelength of EUV light. Therefore, in a case where EUV light (in the vicinity of 13.5 nm) is to be used as inspection light for a pattern, it is considered unnecessary to form a low reflective layer 15 on the absorber layer 14. The wavelength of inspection light tends to be shifted toward a low wavelength side as the size of a pattern becomes small, and in future, it is considered to be shifted to 193 nm or further to 13.5 nm. Here, in the case where the wavelength of inspection light is 193 nm, it may not be required to form a low reflective layer 15 on the absorber layer 14. Further, in the case where the wavelength of inspection light is 13.5 nm, it is considered unnecessary to form a low reflective layer 15 on the absorber layer 14.

Further, in the case of the EUV mask blank 1' shown in FIG. 2, after forming the low reflective layer 15, the above-mentioned heat treatment may be carried out, i.e. the heat treatment applied after forming the absorber layer 14 in the EUV mask blank 1 may be carried out.

Further, the EUV mask blank to be produced by the process of the present invention may have a functional film known in the field of EUV mask blanks, in addition to the reflective layer 12, the protective layer 13, the absorber layer 14 and the low reflective layer 15. A specific example of such a functional film may, for example, be a high dielectric coating to be formed on the rear side of the substrate to promote the electrostatic chucking of the substrate, as disclosed e.g. in JP-A-2003-501823. Here, in the substrate 11 in FIG. 1, the rear side of the substrate means the surface on the opposite side to the side where the reflective layer 12 is formed. For the high dielectric coating to be formed on the rear side of the substrate for such a purpose, the electrical conductivity and thickness of the constituting material are selected so that the sheet resistance will be at most 100Ω/□. The constituting material for the high dielectric coating may be selected widely from those disclosed in known literatures. For example, a high dielectric coating disclosed in JP-A-2003-501823, specifically a coating comprising silicon, TiN, molybdenum, chromium and TaSi, may be applied. The thickness of the high dielectric coating may, for example, be from 10 to 1,000 nm.

The high dielectric coating can be formed by means of a known film-forming method, e.g. a sputtering method such as a magnetron sputtering method or an ion beam sputtering method, a CVD method, a vacuum vapor deposition method or an electroplating method.

The reflective mask for EUV lithography may be obtained by patterning at least the absorber layer (in a case where a low reflective layer is formed on the absorber layer, the absorber layer and the reflective layer) of the EUV mask blank produced by the process of the present invention. In the following, although the description may be made with respect to the absorber layer, in a case where a low reflective layer is formed on the absorber layer, patterning is applied inclusive of the absorber layer and the low reflective layer. Here, the method for patterning of the absorber layer is not particularly limited, and for example, a method may be employed wherein a resist is applied on the absorber layer to form a resist pattern and by using it as a mask, the absorber layer is subjected to etching. The material for the resist, or the drawing method for the resist pattern may suitably be selected in consideration of e.g. the material of the absorber layer, etc. Also the method for etching the absorber layer is not particularly limited, and dry etching such as reactive ion etching, or wet etching, may be employed. After patterning the absorber layer, the resist is removed by a remover liquid to obtain a reflective mask for EUV lithography (an EUV mask).

A process for producing a semiconductor integrated circuit by means of the EUV mask obtainable by the above procedure, will be described. This process is applicable to a process for producing a semiconductor integrated circuit by means of a lithographic method using EUV light as the light source for exposure. Specifically, a substrate such as a silicon wafer coated with a resist is disposed on a stage, and the above EUV mask is set on a reflective exposure device constituted by combination with a reflective mirror. EUV light is applied to the EUV mask via the reflective mirror from the light source to let the EUV light be reflected by the EUV mask and applied to the substrate coated with the resist. By this pattern transfer step, the circuit pattern is transferred on the substrate. The substrate having the circuit pattern transferred, is subjected to development for etching the sensitized portion or non-sensitized portion, and then the resist is removed. A semiconductor integrated circuit will be produced by repeating such a process.

EXAMPLES

Now, the present invention will be further described with reference with Examples. In these Examples, a reflective layer-coated substrate for EUVL (Examples 1 to 3) and an EUV mask blank (Examples 4 and 5) will be produced. Here, the reflective layer-coated substrate for EUVL has a structure having the absorber layer excluded from the mask blank 1 shown in FIG. 1.

Example 1

As a substrate 11 for film formation, a $SiO_2$—$TiO_2$ type glass substrate (size: 6 inch (152.4 mm) square, thickness: 6.3 mm) is used. The thermal expansion coefficient of this glass substrate is $0.05 \times 10^{-7}$/° C., the Young's modulus is 67 GPa, the Poisson ratio is 0.17, and the specific rigidity is $3.07 \times 10^7$ $m^2/s^2$. This glass substrate is polished to form a smooth surface having a surface roughness rms of at most 0.15 nm and a flatness of at most 100 nm.

On the rear side of the substrate 11, a Cr layer having a thickness of 100 nm is formed by a magnetron sputtering method to provide a high dielectric coating (not shown in the drawings) having a sheet resistance of 100Ω/□.

By using the Cr film formed by the above procedure, the substrate 11 is fixed to a usual electrostatic chuck of a flat plate shape, and on the surface of the substrate 11, alternate formation of a Mo layer and a Si layer is repeated 50 cycles to form a Mo/Si multilayer reflective film (reflective layer 12). Here, the uppermost layer of the Mo/Si multilayer reflective layer is a Si layer, and a thin film of SiN is not formed on the Si layer as the uppermost layer. However, after forming each Si layer, by the after-described procedure, the surface of the Si layer is exposed to a nitrogen-containing atmosphere held in a plasma state, and then, a Mo layer is formed. At that time, the total thickness of the Mo layers, the Si layers and the thin films containing Si and N becomes to be 340 nm ((2.3 nm+4.5 nm)×50).

The film forming conditions for the Mo layer and the Si layer are as follows.

Film Forming Conditions for Mo Layer
  Target: Mo target
  Sputtering gas: Ar gas (gas pressure: 0.02 Pa)
  Voltage: 700 V
  Film forming rate: 0.064 nm/sec.
  Film thickness: 2.3 nm
Film Forming Conditions for Si Layer
  Target: Si target (boron-doped)
  Sputtering gas: Ar gas (gas pressure: 0.02 Pa)
  Voltage: 700 V
  Film forming rate: 0.077 nm/sec.
  Film thickness: 4.5 nm After forming a Si layer, the surface of the Si layer is exposed to a nitrogen-containing atmosphere held in a plasma state under the following conditions.
(Exposure Conditions)
  Carrier gas: Ar gas, flow rate: 17 sccm
  Exposure gas: nitrogen gas, flow rate: 50 sccm
  (During RF discharge, the nitrogen gas and the carrier gas are supplied.)
  Nitrogen gas partial pressure: 0.2 mTorr ($2.6 \times 10^{-2}$ Pa)
  Atmosphere pressure: 0.3 mTorr ($3.5 \times 10^{-2}$ Pa)
  Exposure time: 600 sec.
  Exposure amount: $1.2 \times 10^5$ L (1 L (Langmuir)=$1 \times 10^{-7}$ Torr·s=$1.33 \times 10^{-4}$ Pa·s)
  Frequency of RF discharge: 1.8 MHz
  RF power: 500 W Then, a Ru layer as a protective layer 13 is formed by means of an ion beam sputtering method.

The film forming conditions for the protective layer 13 is as follows.
  Target: Ru target
  Sputtering gas: Ar gas (gas pressure: 0.02 Pa)
  Voltage: 700 V
  Film forming rate: 0.052 nm/sec.
  Film thickness: 2.5 nm With respect to the reflective layer-coated substrate for EUVL obtainable by the above procedure, the following evaluation is carried out.

(1) Film Composition

After forming a protective layer 13, the composition in depth direction from the surface of the protective layer 13 to the substrate 11 is measured by means of an X-ray Photoelectron Spectrometer, hereinafter referred to as "XPS" (Quantera SXM, manufactured by Ulvac-Phi Inc.), thereby to confirm that a thin film 12b containing Si and N is formed between each Si layer 12a and Mo layer 12c constituting the Mo/Si multilayer reflective film. The composition of the thin film 12b comprises 6 at % of nitrogen and 94 at % of Si. Further, the thickness of the thin film 12b is 1 nm. Here, the total thickness of the Si layer 12a and the thin film 12b is 4.5 nm.

(2) Surface Roughness

After forming a protective layer 13, the surface roughness of the protective layer 13 is confirmed by means of an Atomic Force Microscope (Number SPI3800, manufactured by Seiko Instruments Inc.) in accordance with JIS-B0601 (1994). The surface roughness of the protective layer 13 is 0.15 nm rms.

(3) Heat Treatment Durability

After forming a protective layer 13, heat treatment (in the air atmosphere) is carried out at 210° C. for 10 minutes. Before and after this treatment, the surface of the protective layer 13 is irradiated with EUV light (wavelength: 13.5 nm), whereby the EUV reflectivity is measured by means of an EUV reflectivity meter (MBR (trade name), manufactured by AIXUV). Based on the measured results, the change in center wavelength of reflected EUV light between before and after the heat treatment is evaluated. A decrease in center wavelength of 0.036 nm is confirmed between before and after the heat treatment. Here, as mentioned above, the center wavelength may be evaluated as the same index as the peak wavelength.

Example 2

Example 2 is carried out in the same procedure as in Example 1 except that in addition to after forming a Si layer, also after forming a Mo layer, the surface of the Mo layer is exposed to a nitrogen-containing atmosphere held in a plasma state under the same exposure conditions as mentioned above, and then, a Si layer is formed.

In the same procedure as in Example 1, the composition in depth direction from the surface of the protective layer 13 to the substrate 11 is measured by means of XPS, thereby to confirm that a thin film 12b containing Si and N is formed between each Si layer 12a and Mo layer 12c constituting the Mo/Si multilayer reflective film. The composition of the thin film 12b comprises 6 at % of nitrogen and 94 at % of Si. Further, the thickness of the thin film 12b is 1 nm. Here, the total thickness of the Si layer 12a and the thin film 12b is 4.5 nm. Further, it is confirmed that a thin film containing Mo and N is formed between each Mo layer and Si layer. The composition of such a thin film comprises 6 at % of nitrogen and 94 at % of Mo. Further, the thickness of the thin film is 0.8 nm. Here, the total thickness of the Mo layer and the thin film is 2.5 nm.

In the same procedure as in Example 1, the surface roughness of the protective layer 13 is measured. The surface roughness of the protective layer 13 is 0.15 nm rms.

In the same procedure as in Example 1, the change in center wavelength of reflected EUV light between before and after the heat treatment is evaluated. A decrease in center wavelength of 0.031 nm is confirmed between before and after the heat treatment.

Example 3

Example 3 is carried out in the same procedure as in Example 1 except that the flow rate of exposure gas (nitrogen gas) at the time of exposing the surface of the Si layer to a nitrogen-containing atmosphere held in a plasma state is 500 sccm, the nitrogen gas partial pressure is 2.0 m Torr ($2.6 \times 10^{-1}$ Pa), and the exposure time is 60 sec.

In the same procedure as in Example 1, the composition in depth direction from the surface of the protective layer 13 to the substrate 11 is measured by means of XPS, thereby to confirm that a thin film 12b containing Si and N is formed between each Si layer 12a and Mo layer 12c constituting the Mo/Si multilayer reflective film. The composition of the thin film 12b comprises 8 at % of nitrogen and 92 at % of Si. Further, the thickness of the thin film 12b is 1 nm. Here, the total thickness of the Si layer 12a and the thin film 12b is 4.5 nm.

In the same procedure as in Example 1, the surface roughness of the protective layer 13 is measured. The surface roughness of the protective layer 13 is 0.15 nm rms.

In the same procedure as in Example 1, the change in center wavelength of reflected EUV light between before and after the heat treatment is evaluated. A decrease in center wavelength of 0.034 nm is confirmed between before and after the heat treatment.

Example 4

In this Example, after preparing a reflective layer-coated substrate for EUVL in the same procedure as in Example 1, a TaBSiN layer as an absorber layer 14 is formed on the protective layer 13 of the reflective layer-coated substrate for EUVL, and a TaBSiON layer as a low reflective layer 15 is formed on the absorber layer 14, to prepare an EUV mask blank 1' as shown in FIG. 2. However, along the peripheral portion (width: 20 mm) of the protective layer 13, masking is applied so that the absorber layer 14 and the low reflective layer 15 are not formed.

The TaBSiN layer as an absorber layer 14 is formed by means of a magnetron sputtering method. The film forming conditions for the TaBSiN layer are as follows.

Film Forming Conditions for TaBSiN Layer

Target: TaBSi compound target (compositional ratio: 80 at % of Ta, 10 at % of B, 10 at % of Si)

Sputtering gas: Mixed gas of Ar and $N_2$ (Ar: 86 vol %, $N_2$: 14 vol %, gas pressure: 0.3 Pa)

Applied power: 150 W

Film forming rate: 0.12 nm/sec.

Film thickness: 60 nm

The TaBSiON layer as a low reflective layer 15 is formed by means of a magnetron sputtering method. The film forming conditions for the TaBSiON layer are as follows.

Film Forming Conditions for TaBSiON Layer

Target: TaBSi compound target (compositional ratio: 80 at % of Ta, 10 at % of B, 10 at % of Si)

Sputtering gas: Mixed gas of Ar, $N_2$ and $O_2$ (Ar: 60 vol %, $N_2$: 20 vol %, $O_2$: 20 vol %, gas pressure: 0.3 Pa)

Applied power: 150 W

Film forming rate: 0.18 nm/sec.

Film thickness: 10 nm

With respect to the EUV mask blank obtainable by the above procedure, heat treatment durability is evaluated by the following procedure.

After forming the low reflective layer 15, heat treatment (in the air atmosphere) is carried out at 210° C. for 10 minutes. Before and after this treatment, the surface of the portion where the protective layer 13 is exposed along the peripheral portion of the mask blank (the portion where the absorber layer 14 and the low reflective layer 15 are not formed due to masking), is irradiated with EUV light (wavelength: 13.5 nm), whereby the EUV reflectivity is measured by means of an EUV reflectivity meter (MBR (trade name), manufactured by AIXUV). Based on the measured results, the change in center wavelength of reflected EUV light between before and after the heat treatment is evaluated. A decrease in center wavelength of 0.036 nm is confirmed between before and after the heat treatment.

Example 5

In this Example, an EUV mask blank is prepared in the same procedure as in Example 4.

The EUV mask blank after formation of a low reflective layer 15 is subjected to heat treatment for 20 minutes by controlling it in the air atmosphere within a range of 140±4° C. Here, the temperature is the temperature of the surface of the mask blank, and the heating time is the time during which the temperature of the mask blank surface is held within a range of 140±4° C.

With respect to the EUV mask blank after the heat treatment, the heat treatment durability is evaluated in the same procedure as in Example 4. A decrease in center wavelength of 0.022 nm is confirmed between before and after the heat treatment.

Comparative Example 1

Comparative Example 1 is carried out in the same procedure as in Example 1 except that the Si layer surface is exposed to a nitrogen-containing atmosphere not held in a plasma state in accordance with the following conditions.
(Exposure Conditions)
Atmosphere gas: Ar gas (carrier gas), flow rate: 17 sccm, nitrogen gas, flow rate: 50 sccm
Nitrogen gas partial pressure: 0.2 mTorr ($2.6 \times 10^{-2}$ Pa)
Atmosphere pressure: 0.3 mTorr ($3.5 \times 10^{-2}$ Pa)
Exposure time: 600 sec.
Nitrogen partial pressure×heat treating time (exposure time to nitrogen-containing atmosphere): $1.2 \times 10^5$ L (1 L (Langmuir)=$1 \times 10^{-6}$ Torr·s=$1.33 \times 10^{-4}$ Pa·s)

In the same procedure as in Example 1, the composition in depth direction from the surface of the protective layer 13 to the substrate 11 is measured by means of XPS thereby to confirm that a thin layer 12b containing Si and N is formed between each Si layer 12a and Mo layer 12c. The composition of the thin film 12b comprises 0.2 at % of nitrogen and 99.8 at % of Si. Further, the thickness of the thin film 12b is 1 nm. Here, the total thickness of the Si layer 12a and the thin film 12b is 4.5 nm.

In the same procedure as in Example 1, the surface roughness of the protective layer 13 is measured. The surface roughness of the protective layer 13 is 0.15 nm rms.

In the same procedure as in Example 1, the change in center wavelength of reflected EUV light between before and after the heat treatment is measured. A decrease in center wavelength of 0.050 nm is confirmed between before and after the heat treatment.

Comparative Example 2

Comparative Example 2 is carried out in the same procedure as in Example 1 except that after forming a Si layer, without exposing the surface of the Si layer to a nitrogen-containing atmosphere held in a plasma state, a Mo layer is formed.

In the same procedure as in Example 1, the composition in depth direction from the surface of the protective layer 13 to the substrate 11 is measured by means of XPS thereby to confirm that a thin layer 12b containing Si and N is not formed between each Si layer 12a and Mo layer 12c.

In the same procedure as in Example 1, the surface roughness of the protective layer 13 is measured. The surface roughness of the protective layer 13 is 0.15 nm rms.

In the same procedure as in Example 1, the change in center wavelength of reflected EUV light between before and after the heat treatment is measured. A decrease in center wavelength of 0.051 nm is confirmed between before and after the heat treatment.

The entire disclosure of Japanese Patent Application No. 2013-251971 filed on Dec. 5, 2013 including specification, claims, drawings and summary is incorporated herein by reference in its entirety.

REFERENCE SYMBOLS 1, 1': EUV mask blank
11: Substrate
12: Reflective layer (Mo/Si multilayer reflective film)
12a: Si layer
12b: Thin film containing Si and N
12c: Mo layer
13: Protective layer
14: Absorber layer
15: Low reflective layer

What is claimed is:

1. A process for producing a reflective layer-coated substrate for EUV lithography, comprising:
  forming on a substrate a Mo/Si multilayer reflective film comprising a plurality of Mo layers and a plurality of Si layers such that the Mo layers and the Si layers are alternately stacked on a film-forming surface of the substrate,
  wherein the forming of the Mo/Si multilayer reflective film comprises exposing a surface of each of the Si layers to a nitrogen-containing atmosphere held in a plasma state without being exposed to an air atmosphere such that the Mo/Si multilayer reflective film has a plurality of thin films formed between the Si layers and the Mo layers, respectively, and that each of the thin films includes nitrogen in an amount of from 0.5 to 25 at % and Si in an amount of from 75 to 99.5 at % and has a film thickness in a range of from 0.2 nm to 2.0 nm.

2. The process for producing a reflective layer-coated substrate for EUVL according to claim 1, further comprising:
  exposing an uppermost layer of the Mo/Si multilayer reflective film to a nitrogen-containing atmosphere held in a plasma state without being exposed to the air atmosphere such that the Si layers in the Mo/Si multilayer reflective film include a Si layer forming the uppermost layer of the Mo/Si multilayer reflective film.

3. The process for producing a reflective layer-coated substrate for EUVL according to claim 1, further comprising:
  exposing a surface of at least one Mo layer of the Mo layers to a nitrogen-containing atmosphere held in a plasma state without being exposed to the air atmosphere such that the Mo/Si multilayer reflective film includes at least one second thin film including nitrogen in an amount of from 0.5 to 25 at % and Mo in an amount of from 75 to 99.5 at % and having a film thickness in a range of from 0.2 nm to 2.0 nm.

4. The process for producing a reflective layer-coated substrate for EUVL according to claim 1, wherein the Si layers are exposed to the nitrogen-containing atmosphere such that a product of the nitrogen partial pressure of the nitrogen-containing atmosphere and an exposure time is at least $1 \times 10^{-6}$ Torr·s.

5. The process for producing a reflective layer-coated substrate for EUVL according to claim 1, further comprising:
forming a protective layer comprising a ruthenium layer or a Ru compound layer on the Mo/Si multilayer reflective film.

6. A process for producing a reflective mask blank for EUV lithography, comprising:
forming on a substrate a Mo/Si multilayer reflective film comprising a plurality of Mo layers and a plurality of Si layers such that the Mo layers and the Si layers are alternately stacked on a film-forming surface of the substrate; and
forming on the Mo/Si multilayer reflective film an absorber layer for absorbing EUV light,
wherein the forming of the Mo/Si multilayer reflective film comprises exposing a surface of each of the Si layers to a nitrogen-containing atmosphere held in a plasma state without being exposed to an air atmosphere such that the Mo/Si multilayer reflective film has a plurality of thin films formed between the Si layers and the Mo layers, respectively, and that each of the thin films includes nitrogen in an amount of from 0.5 to 25 at % and Si in an amount of from 75 to 99.5 at % and has a film thickness in a range of from 0.2 nm to 2.0 nm.

7. The process for producing a reflective mask blank for EUVL according to claim 6, further comprising:
exposing an uppermost layer of the Mo/Si multilayer reflective film to a nitrogen-containing atmosphere held in a plasma state without being exposed to the air atmosphere such that the Si layers in the Mo/Si multilayer reflective film include a Si layer forming the uppermost layer of the Mo/Si multilayer reflective film.

8. The process for producing a reflective mask blank for EUVL according to claim 6, further comprising:
exposing a surface of at least one Mo layer of the Mo layers to a nitrogen-containing atmosphere held in a plasma state without being exposed to the air atmosphere such that the Mo/Si multilayer reflective film includes at least one second thin film including nitrogen in an amount of from 0.5 to 25 at % and Mo in an amount of from 75 to 99.5 at % and having a film thickness in a range of from 0.2 nm to 2.0 nm.

9. The process for producing a reflective mask blank for EUVL according to claim 6, wherein the Si layers are exposed to the nitrogen-containing atmosphere such that a product of the nitrogen partial pressure of the nitrogen-containing atmosphere and an exposure time is at least $1 \times 10^{-6}$ Torr·s.

10. The process for producing a reflective mask blank for EUVL according to claim 6, further comprising:
applying heat treatment at a temperature in a range of from 110° C. to 160° C. after forming the absorber layer.

11. The process for producing a reflective mask blank for EUVL according to claim 6, further comprising:
forming a protective layer comprising a ruthenium layer or a Ru compound layer on the Mo/Si multilayer reflective film.

12. The process for producing a reflective mask blank for EUVL according to claim 6, further comprising:
forming, on the absorber layer, a low reflective layer such that the low reflective layer has a low light reflectivity to inspection light for inspection of a mask pattern.

13. The process for producing a reflective mask blank for EUVL according to claim 12, further comprising:
applying heat treatment at a temperature in a range of from 110° C. to 160° C. after forming the low reflective layer.

14. A reflective layer-coated substrate for EUVL, comprising:
a substrate; and
a Mo/Si multilayer reflective film comprising a plurality of Mo layers and a plurality of Si layers such that the Mo layers and the Si layers are alternately stacked on the substrate,
wherein the Mo/Si multilayer reflective film comprises a plurality of thin films formed between the Si layers and the Mo layers such that each of the thin films includes nitrogen in an amount of from 0.5 to 25 at % and Si in an amount of from 75 to 99.5 at % and has a film thickness in a range of from 0.2 nm to 2.0 nm.

15. The reflective layer-coated substrate for EUVL according to claim 14, wherein the Si layers in the Mo/Si multilayer reflective film include a Si layer forming an uppermost layer of the Mo/Si multilayer reflective film, and the thin films in the Mo/Si multilayer reflective film include a thin film formed on the Si layer forming the uppermost layer.

16. The reflective layer-coated substrate for EUVL according to claim 14, wherein the Mo/Si multilayer reflective film comprises a plurality of second thin films formed between the Mo layers and the Si layers such that each of the second thin films includes nitrogen in an amount of from 0.5 to 25 at % and Mo in an amount of from 75 to 99.5 at % and has a film thickness in a range of from 0.2 nm to 2.0 nm.

17. The reflective layer-coated substrate for EUVL according to claim 14, further comprising:
a protective layer comprising a ruthenium layer or a Ru compound layer formed on the Mo/Si multilayer reflective film.

18. A reflective mask blank for EUVL, comprising:
the reflective layer-coated substrate of claim 14; and
an absorber layer formed on the Mo/Si multilayer reflective film of the reflective layer-coated substrate for EUVL.

19. A reflective mask blank for EUVL, comprising:
the reflective layer-coated substrate of claim 17; and
an absorber layer formed on the protective layer of the Mo/Si multilayer reflective film of the reflective layer-coated substrate for EUVL.

20. The reflective mask blank for EUVL according to claim 18, further comprising:
a low reflective layer formed on the absorber layer such that the low reflective layer has a low light reflectivity to inspection light for inspection of a mask pattern.

* * * * *